(12) United States Patent  (10) Patent No.: US 7,521,915 B2
Herchen et al.  (45) Date of Patent: Apr. 21, 2009

(54) WAFER BEVEL PARTICLE DETECTION

(75) Inventors: Harald Herchen, Los Altos, CA (US); Christopher L. Beaudry, San Jose, CA (US)

(73) Assignee: Sokudo Co., Ltd., Kyoto (JP)

( * ) Notice: Subject to any disclaimer, the term of this patent is extended or adjusted under 35 U.S.C. 154(b) by 1 day.

(21) Appl. No.: 11/412,058

(22) Filed: Apr. 25, 2006

(65) Prior Publication Data

US 2007/0247137 A1  Oct. 25, 2007

(51) Int. Cl.
*G01R 31/28* (2006.01)
(52) U.S. Cl. .................. 324/71.4; 324/158.1; 324/409; 324/410; 324/758; 324/536
(58) Field of Classification Search ............... 324/71.4, 324/158.1, 409, 410, 758, 536
See application file for complete search history.

(56) References Cited

U.S. PATENT DOCUMENTS

| | | | | |
|---|---|---|---|---|
| 5,176,783 | A * | 1/1993 | Yoshikawa | 156/345.15 |
| 5,271,970 | A | 12/1993 | Gribbin et al. | |
| 5,517,110 | A | 5/1996 | Soiferman | |
| 5,955,886 | A | 9/1999 | Cohen et al. | |
| 5,982,166 | A * | 11/1999 | Mautz | 324/158.1 |
| 6,091,249 | A * | 7/2000 | Talbot et al. | 324/751 |
| 6,114,865 | A | 9/2000 | Lagowski et al. | |
| 6,184,686 | B1 * | 2/2001 | Mazor et al. | 324/464 |
| 6,232,787 | B1 * | 5/2001 | Lo et al. | 324/751 |
| 6,538,462 | B1 | 3/2003 | Lagowski et al. | |
| 6,682,603 | B2 * | 1/2004 | Gondhalekar et al. | 118/728 |
| 2004/0012775 | A1 * | 1/2004 | Kinney et al. | 356/237.2 |
| 2006/0130767 | A1 | 6/2006 | Herchen | |

FOREIGN PATENT DOCUMENTS

JP 05291098 A * 11/1993
JP 09109008 A * 4/1997

OTHER PUBLICATIONS

Turner, Rufus et al., The Illustrated Dictionary of Electronics, Fourth Edition, TAB Professional and Reference Books, 1988, p. 475.*

(Continued)

*Primary Examiner*—Timothy J. Dole
*Assistant Examiner*—Thomas F. Valone
(74) *Attorney, Agent, or Firm*—Townsend and Townsend and Crew LLP

(57) ABSTRACT

An apparatus adapted to detect a particle present on a bevel of a wafer. The apparatus includes a substrate support and a sensor housing adapted to receive an edge of the wafer. The sensor housing includes one or more probe electrodes and one or more position sensors. The apparatus also includes a translatable stage coupled to the sensor housing. The translatable stage is adapted to control the distance between the bevel of the wafer and the one or more position sensors. The apparatus further includes electrical circuitry electrically coupled to the substrate support and the one or more probe electrodes and adapted to generate an electric field between the bevel of the wafer and the one or more probe electrodes, detection circuitry electrically coupled to the electrical circuitry, and a processor adapted to process electrical signals and thereby detect the particle present on the bevel of the wafer.

20 Claims, 4 Drawing Sheets

OTHER PUBLICATIONS

Yoshikawa, Kiyoshi. Semiconductor wafer processing device, PTO Translation of JP5-291098, PTO 08-5398.*

IBM TDB NA84092024, "Open/Short Testing", Sep. 1984, vol. 27, No. 4A, (Sep. 1, 1984), pp. 2024-2025.

IBM TDB NN80081128, "Bed of Nails Fixture for Printed Circuit Board Testing" Aug. 1980, vol. 23, No. 3,(Aug. 1, 1980), pp. 1228-1230.

Goldman et al., "Plasma-surface interaction phenomena induced by corona discharges. Application to aerosols detection and to diagnosis on surface layers," Pure & Appl. Chem., vol. 64, No. 5, (1992), pp. 759-763.

Reedyk et al., "The Measurement of Surface Charge," *J. Electrochem. Soc.*, (Jan. 1968), vol. 115, No. 1, pp. 49-51.

* cited by examiner

WAFER BEVEL PARTICLE DETECTION

BACKGROUND OF THE INVENTION

The present invention relates generally to the field of substrate processing equipment. More particularly, the present invention relates to the detection of particles on a bevel of a semiconductor substrate. Merely by way of example, the method and apparatus of the present invention are used to detect particles in a photolithography coating system using a corona discharge technique. The method and apparatus can be applied to other processes for semiconductor substrates, for example those used in the formation of integrated circuits.

Modern integrated circuits contain millions of individual elements that are formed by patterning the materials, such as silicon, metal and/or dielectric layers, which make up the integrated circuit, to sizes that are small fractions of a micrometer. The technique used throughout the industry for forming such patterns is photolithography. A typical photolithography process sequence generally includes depositing one or more uniform photoresist (resist) layers on the surface of a substrate, drying and curing the deposited layers, patterning the substrate by exposing the photoresist layer to electromagnetic radiation that is suitable for modifying the exposed layer, and then developing the patterned photoresist layer.

It is common in the semiconductor industry for many of the steps associated with the photolithography process to be performed in a multi-chamber processing system (e.g., a cluster tool) that has the capability to sequentially process semiconductor wafers in a controlled manner. One example of a cluster tool that is used to deposit (i.e., coat) and develop a photoresist material is commonly referred to as a track lithography tool.

Track lithography tools typically include a mainframe that houses multiple chambers (which are sometimes referred to herein as stations) dedicated to performing the various tasks associated with pre- and post-lithography processing. There are typically both wet and dry processing chambers within track lithography tools. Wet chambers include coat and/or develop bowls, while dry chambers include thermal control units that house bake and/or chill plates. Track lithography tools also frequently include one or more pod/cassette mounting devices, such as an industry standard FOUP (front opening unified pod), to receive substrates from and return substrates to the clean room, multiple substrate transfer robots to transfer substrates between the various chambers/stations of the track tool, and an interface that allows the tool to be operatively coupled to a lithography exposure tool in order to transfer substrates into the exposure tool and receive substrates from the exposure tool after the substrates are processed within the exposure tool.

Over the years there has been a strong push within the semiconductor industry to shrink the size of semiconductor devices. As device size has decreased, the importance of reducing the presence of contaminant particles has increased since such particles may lead to the formation of defects during the semiconductor fabrication process. In order to maintain high manufacturing yield and low costs, the detection and removal of contaminant particles is desirable. Particles present on the wafer bevel may be dislodged and adhere to the front side of the wafer, potentially damaging integrated circuits formed on the front side of the wafer. Moreover, if particles present on the wafer bevel are dislodged and adhere to the backside of the wafer, non-planarity during lithography may result in lithographic depth of focus errors.

Some particle detection systems use optical detection methods that use a small laser spot to scan the backside of the substrate or wafer to detect light scattered off particles. However, these systems are not generally configured to detect particles present on the non-planar bevel of a substrate presents. Additionally, these particle detection systems do not provide the level of control desirable for bevel particle detection on current and future track lithography tools. Therefore, there is a need in the art for improved methods and apparatus for detecting particles on the backside of a semiconductor substrate in a track lithography tool.

SUMMARY OF THE INVENTION

According to embodiments of the present invention, techniques related to the field of substrate processing equipment are provided. More particularly, the present invention relates to the detection of particles on a bevel of a semiconductor substrate. Merely by way of example, the method and apparatus of the present invention are used to detect particles in a photolithography coating system using a corona discharge technique. The method and apparatus can be applied to other processes for semiconductor substrates, for example those used in the formation of integrated circuits.

According to an embodiment of the present invention, an apparatus adapted to detect a particle present on a bevel of a wafer is provided. The apparatus includes a substrate support adapted to support the wafer in a substantially horizontal orientation and provide electrical contact to the wafer and a sensor housing adapted to receive an edge of the wafer. The sensor housing includes one or more probe electrodes and one or more position sensors adapted to monitor a distance between the bevel of the wafer and the one or more probe electrodes. The apparatus also includes a translatable stage coupled to the sensor housing. The translatable stage is adapted to control the distance between the bevel of the wafer and the one or more position sensors. The apparatus further includes electrical circuitry electrically coupled to the substrate support and the one or more probe electrodes and adapted to generate an electric field between the bevel of the wafer and the one or more probe electrodes, detection circuitry electrically coupled to the electrical circuitry, and a processor adapted to process electrical signals associated with the detection circuitry and thereby detect the particle present on the bevel of the wafer.

According to another embodiment of the present invention, a method of detecting a particle attached to a bevel of a substrate is provided. The method includes positioning a probe electrode adjacent to the bevel of the substrate, providing an electric potential between the bevel of the substrate and a probe electrode, and rotating the substrate. The method also includes detecting a corona discharge between the bevel of the substrate and a probe electrode and correlating the corona discharge with a presence of the particle.

According to an alternative embodiment of the present invention, a method of detecting a particle present on a bevel of a substrate is provided. The method includes supporting the substrate on a substrate support, positioning a probe housing comprising a probe electrode adjacent to the bevel of the substrate, and applying a voltage potential between the bevel of the substrate and the probe electrode. The method also includes rotating the substrate, measuring a first voltage potential at a first time, and establishing a baseline potential based in part on measuring the voltage potential. The method further includes measuring a second voltage potential at a second time. The second voltage potential is less than the first voltage potential. Additionally, the method includes correlating the second voltage potential with the particle.

Many benefits are achieved by way of the present invention over conventional techniques. For example, an embodiment provides a method of detecting wafer bevel particles that is utilized after post-apply bake (PAB) and prior to exposure, enabling removal of detected particles prior to placement of the wafer in the scanner. By removing particles prior to exposure, the probability of particles being present on the scanner chuck is reduced, obviating focus errors resulting from the presence of such particles. For immersion lithography applications, as the immersion fluid passes over or along the edge of the wafer, particles could be entrained and then move to front portions of the wafer containing dies. Detecting particles present on the bevel of the wafer using embodiments of the present invention, appropriate action can be taken to remove such particles. Moreover, for edge grip robots, such as are commonly used, the absence of particles can be important when gripping, so that particles don't get spread out elsewhere on the wafer either through crushing of the particles into a spray of particles, or through local air flow entraining the particles out and onto the top of the wafer. Additionally, wafers are typically held in FOUPS, where they are supported on the sides and prevented from translating by fingers that touch the sides. A reduction of particles on the edge of the wafer, enabled by their detection, allows a reduction in the number of particles being dislodged as the wafers in the FOUP get jostled during transport. Depending upon the embodiment, one or more of these benefits, as well as other benefits, may be achieved. These and other benefits will be described in more detail throughout the present specification and more particularly below in conjunction with the following drawings.

DETAILED DESCRIPTION OF SPECIFIC EMBODIMENTS

Figure 1:
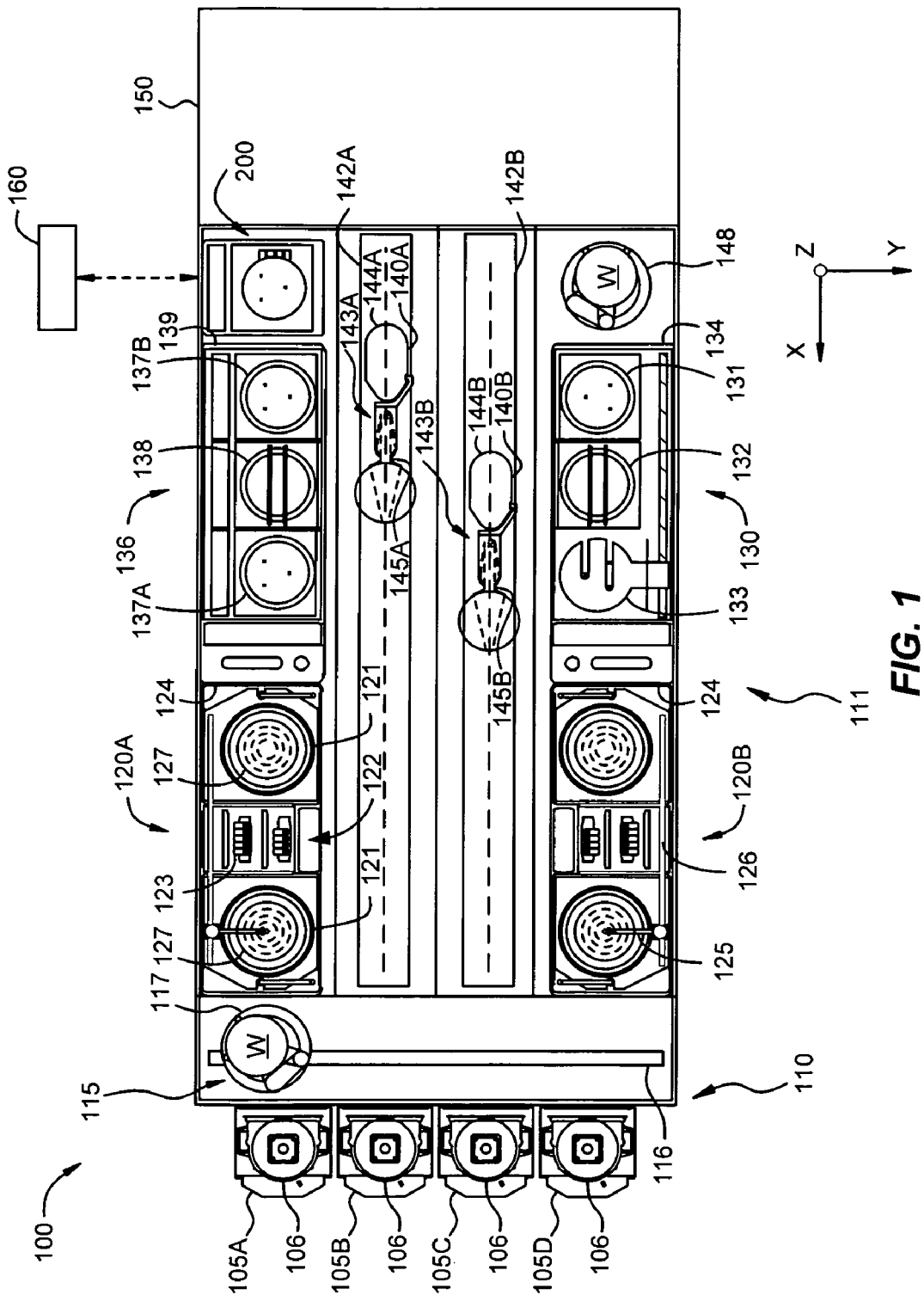
FIG. 1 is a simplified plan view of an embodiment of a track lithography tool according to an embodiment of the present invention.

FIG. 1 is a plan view of an embodiment of a track lithography tool 100 in which the embodiments of the present invention may be used. As illustrated in FIG. 1, track lithography tool 100 contains a front end module 110 (sometimes referred to as a factory interface or FI) and a process module 111. In other embodiments, the track lithography tool 100 includes a rear module (not shown), which is sometimes referred to as a scanner interface. Front end module 110 generally contains one or more pod assemblies or FOUPS (e.g., items 105A-D) and a front end robot assembly 115 including a horizontal motion assembly 116 and a front end robot 117. The front end module 110 may also include front end processing racks (not shown). The one or more pod assemblies 105A-D are generally adapted to accept one or more cassettes 106 that may contain one or more substrates or wafers, "W," that are to be processed in track lithography tool 100. The front end module 110 may also contain one or more pass-through positions (not shown) to link the front end module 110 and the process module 111.

Process module 111 generally contains a number of processing racks 120A, 120B, 130, and 136. As illustrated in FIG. 1, processing racks 120A and 120B each include a coater/developer module with shared dispense 124. A coater/developer module with shared dispense 124 includes two coat bowls 121 positioned on opposing sides of a shared dispense bank 122, which contains a number of nozzles 123 providing processing fluids (e.g., bottom anti-reflection coating (BARC) liquid, resist, developer, and the like) to a wafer mounted on a substrate support 127 located in the coat bowl 121. In the embodiment illustrated in FIG. 1, a dispense arm 125 sliding along a track 126 is able to pick up a nozzle 123 from the shared dispense bank 122 and position the selected nozzle over the wafer for dispense operations. Of course, coat bowls with dedicated dispense banks are provided in alternative embodiments.

Processing rack 130 includes an integrated thermal unit 134 including a bake plate 131, a chill plate 132, and a shuttle 133. The bake plate 131 and the chill plate 132 are utilized in heat treatment operations including post exposure bake (PEB), post-resist bake, and the like. In some embodiments, the shuttle 133, which moves wafers in the x-direction between the bake plate 131 and the chill plate 132, is chilled to provide for initial cooling of a wafer after removal from the bake plate 131 and prior to placement on the chill plate 132. Moreover, in other embodiments, the shuttle 133 is adapted to move in the z-direction, enabling the use of bake and chill plates at different z-heights. Processing rack 136 includes an integrated bake and chill unit 139, with two bake plates 137A and 137B served by a single chill plate 138.

One or more robot assemblies (robots) 140 are adapted to access the front-end module 110, the various processing modules or chambers retained in the processing racks 120A, 120B, 130, and 136, and the scanner 150. By transferring substrates between these various components, a desired processing sequence can be performed on the substrates. The two robots 140 illustrated in FIG. 1 are configured in a parallel processing configuration and travel in the x-direction along horizontal motion assembly 142. Utilizing a mast structure (not shown), the robots 140 are also adapted to move in a vertical (z-direction) and horizontal directions, i.e., transfer direction (x-direction) and a direction orthogonal to the transfer direction (y-direction). Utilizing one or more of these three directional motion capabilities, robots 140 are able to place wafers in and transfer wafers between the various processing chambers retained in the processing racks that are aligned along the transfer direction.

Referring to FIG. 1, the first robot assembly 140A and the second robot assembly 140B are adapted to transfer substrates to the various processing chambers contained in the processing racks 120A, 120B, 130, and 136. In one embodiment, to perform the process of transferring substrates in the track lithography tool 100, robot assembly 140A and robot assembly 140B are similarly configured and include at least one horizontal motion assembly 142, a vertical motion assembly 144, and a robot hardware assembly 143 supporting a robot blade 145. robot assemblies 140 are in communication with a system controller 160. In the embodiment illustrated in FIG. 1, a rear robot assembly 148 is also provided.

The scanner 150, which may be purchased from Canon USA, Inc. of San Jose, Calif., Nikon Precision Inc. of Belmont, Calif., or ASML US, Inc. of Tempe Ariz., is a lithographic projection apparatus used, for example, in the manufacture of integrated circuits (ICs). The scanner 150 exposes a photosensitive material (resist), deposited on the substrate in the cluster tool, to some form of electromagnetic radiation to generate a circuit pattern corresponding to an individual layer of the integrated circuit (IC) device to be formed on the substrate surface.

Each of the processing racks 120A, 120B, 130, and 136 contain multiple processing modules in a vertically stacked arrangement. That is, each of the processing racks may contain multiple stacked coater/developer modules with shared dispense 124, multiple stacked integrated thermal units 134, multiple stacked integrated bake and chill units 139, or other modules that are adapted to perform the various processing steps required of a track photolithography tool. As examples, coater/developer modules with shared dispense 124 may be used to deposit a bottom antireflective coating (BARC) and/or deposit and/or develop photoresist layers. Integrated thermal units 134 and integrated bake and chill units 139 may perform bake and chill operations associated with hardening BARC and/or photoresist layers after application or exposure.

In one embodiment, a system controller 160 is used to control all of the components and processes performed in the cluster tool 100. The controller 160 is generally adapted to communicate with the scanner 150, monitor and control aspects of the processes performed in the cluster tool 100, and is adapted to control all aspects of the complete substrate processing sequence. The controller 140, which is typically a microprocessor-based controller, is configured to receive inputs from a user and/or various sensors in one of the processing chambers and appropriately control the processing chamber components in accordance with the various inputs and software instructions retained in the controller's memory. The controller 140 generally contains memory and a CPU (not shown) which are utilized by the controller to retain various programs, process the programs, and execute the programs when necessary. The memory (not shown) is connected to the CPU, and may be one or more of a readily available memory, such as random access memory (RAM), read only memory (ROM), floppy disk, hard disk, or any other form of digital storage, local or remote. Software instructions and data can be coded and stored within the memory for instructing the CPU. The support circuits (not shown) are also connected to the CPU for supporting the processor in a conventional manner. The support circuits may include cache, power supplies, clock circuits, input/output circuitry, subsystems, and the like all well known in the art. A program (or computer instructions) readable by the controller 140 determines which tasks are performable in the processing chamber(s). Preferably, the program is software readable by the controller 160 and includes instructions to monitor and control the process based on defined rules and input data.

It is to be understood that embodiments of the invention are not limited to use with a track lithography tool such as that depicted in FIG. 1. Instead, embodiments of the invention may be used in any track lithography tool including the many different tool configurations described in U.S. patent application Ser. No. 11/315,984, entitled "Cartesian Robot Cluster Tool Architecture" filed on Dec. 22, 2005, which is hereby incorporated by reference for all purposes and including configurations not described in the above referenced application.

Referring to FIG. 1, a wafer bevel particle detection apparatus 200 is provided as a module in the track lithography tool 100. The wafer bevel particle detection apparatus 200 is serviced by one or both of the robot assemblies 140 and is utilized, as described more fully throughout the present specification, to detect particles present on the bevel of a wafer or substrate. The use of the wafer bevel particle detection apparatus 200 may occur before or after several of the wafer processes performed within the track lithography tool 100. These wafer processing include coat, develop, bake, chill, exposure, and the like. In a particular embodiment, the substrate is scanned for particles prior to processing by the scanner. In alternative embodiments, the wafer bevel particle detection apparatus 200 is located external to the track lithography tool 100 in a separate stand-alone test module. One of ordinary skill in the art would recognize many variations, modifications, and alternatives.

According to embodiments of the present invention, current flow or voltage drops accompanying a corona discharge are utilized to detect the presence of a particle on the bevel of a substrate. A corona discharge is produced when a sharp point at a positive potential (a charged conductor) is characterized by a high surface charge density. For a charged conductor with sharp points, the value of the electric field in the air near the points can be high. At a sufficiently high value of the electric field, ions present in the air will be accelerated toward the conductor, and by collision with air molecules, will produce additional ions. Thus the air, or other gaseous environment such as nitrogen in the vicinity of the charged conductor, is made more conducting and a corona discharge will result, thereby discharging the stored charge on the conductor to ground.

For bevel particle detection applications, particles present on the bevel of the substrate provide the sharp points at which the corona discharge is produced. Thus, referring to FIG. 3, the illustrated particle will provide the feature at which corona discharge results, enabling the presence of the particle to be detected. In embodiments of the present invention, the occurrence of a corona discharge on the bevel of the wafer will be utilized in detecting such particles without damage to the front of the wafer, where integrated circuits are present. Preferably any damage caused to the bevel of the wafer as a result of this corona discharge will be below levels that impact the reliability of the integrated circuits formed on the wafer.

Figure 2:
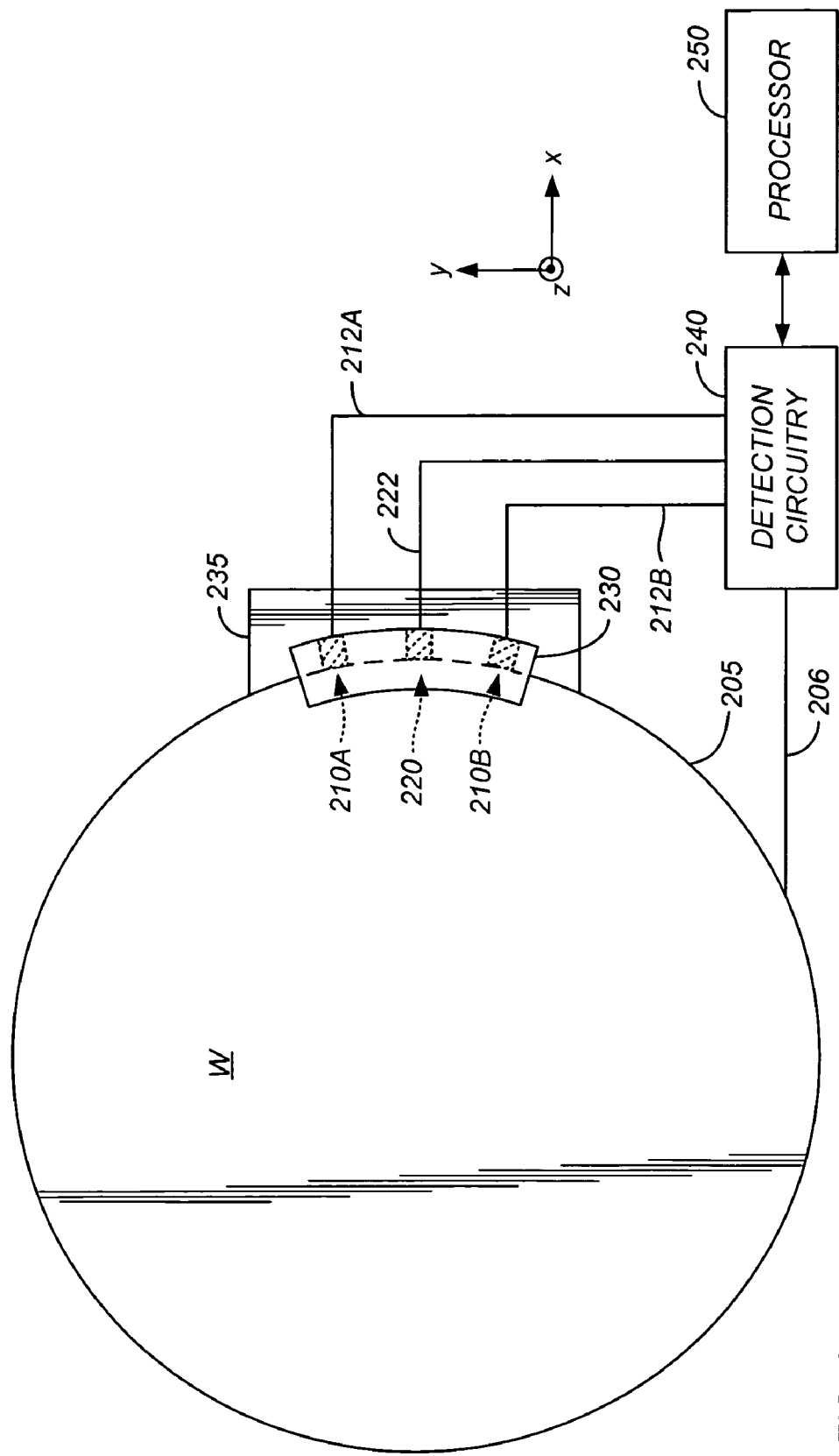
FIG. 2 is a simplified schematic diagram illustrating a top view of a wafer bevel particle detection apparatus according to an embodiment of the present invention.

FIG. 2 is a simplified schematic diagram illustrating a top view of a wafer bevel particle detection apparatus 200 according to an embodiment of the present invention. Wafer "W" is supported by a substrate support (not shown) in a substantially horizontal position. Sensor housing 230 includes one or more position sensors 210A, 210B as well as one or more probe electrodes 220. Electrical connections 212A, 212B are provided between position sensors 210 and detection circuitry 240. Additional electrical connections 222 are provided between the one or more probe electrodes 220 and detection circuitry 240. Although not illustrated in FIG. 2, electrical contact is made to a portion of the backside of the wafer and electrical connection 206 is thus provided between the contacted portion of the backside of the wafer and detection circuitry 240. Processor 250 is connected to detection circuitry 240.

Sensor housing 230 is mounted on a translatable stage 235 that is adapted to move in the x-direction (radial direction), the y-direction (in the plane of the substrate), and the z-direction (normal to the surface of the substrate). In some embodiments, the translatable stage 235 is also adapted to rotate about the z-axis. The sensor housing 230 is positioned in FIG. 2 to partially surround a portion of the wafer bevel 205. As described more fully throughout the present specification, the translatable stage 235 is utilized to position the probe electrodes with respect to the substrate and thereby form a predetermined gap between the wafer bevel and the probe electrodes. According to embodiments of the present invention, the predetermined gap ranges from about 3 μm to about 100 μm. In a particular embodiment, the predetermined gap is about 5 μm. Of course, the predetermined gap will vary as appropriate to the particular application.

In order to position the sensor housing 230 in a predetermined relationship with respect to the edge of the wafer, position sensors 210A and 210B are utilized along with detection circuitry 240 and processor 250. In a particular embodiment, the position sensors are capacitive sensors that measure the capacitance between a plate of the position sensor 210 and the wafer bevel. The measured capacitance value is used to determine the distance or gap between the plate of the position sensor and the wafer bevel. The gap between the wafer bevel and the probe electrode is maintained at the predetermined value during rotation of the wafer.

According to embodiments of the present invention, the position sensors are utilized to monitor the gap between the wafer and the one or more probe electrodes during rotation of the wafer. Position data from the position sensors 210 is utilized by the processor 250 to control the position of the translatable stage 235, which moves in response to the position sensor measurements and establishes the predetermined gap desired.

In addition to capacitive sensors, other suitable position sensors including, for example, optical sensors and laser alignment sensors may be utilized. Moreover, mechanical positioning of the probe electrodes is utilized in an embodiment. One of ordinary skill in the art would recognize many variations, modifications, and alternatives.

In an embodiment of the present invention, a method of detecting particles present on the wafer bevel includes rotating the substrate or wafer "W" so that portions of the wafer bevel adjacent the sensor housing 230 pass by probe electrode 220 in a sequential manner. The rotation rate of the wafer is a value within a predetermined range. For example, the rotation rate of the wafer is between about 2 RPM and about 50 RPM. In a particular embodiment, the rotation rate the wafer is about 12 RPM. Rotation rates in this range provide for real-time adjustment of the sensor housing position as described more fully below.

Figure 3:
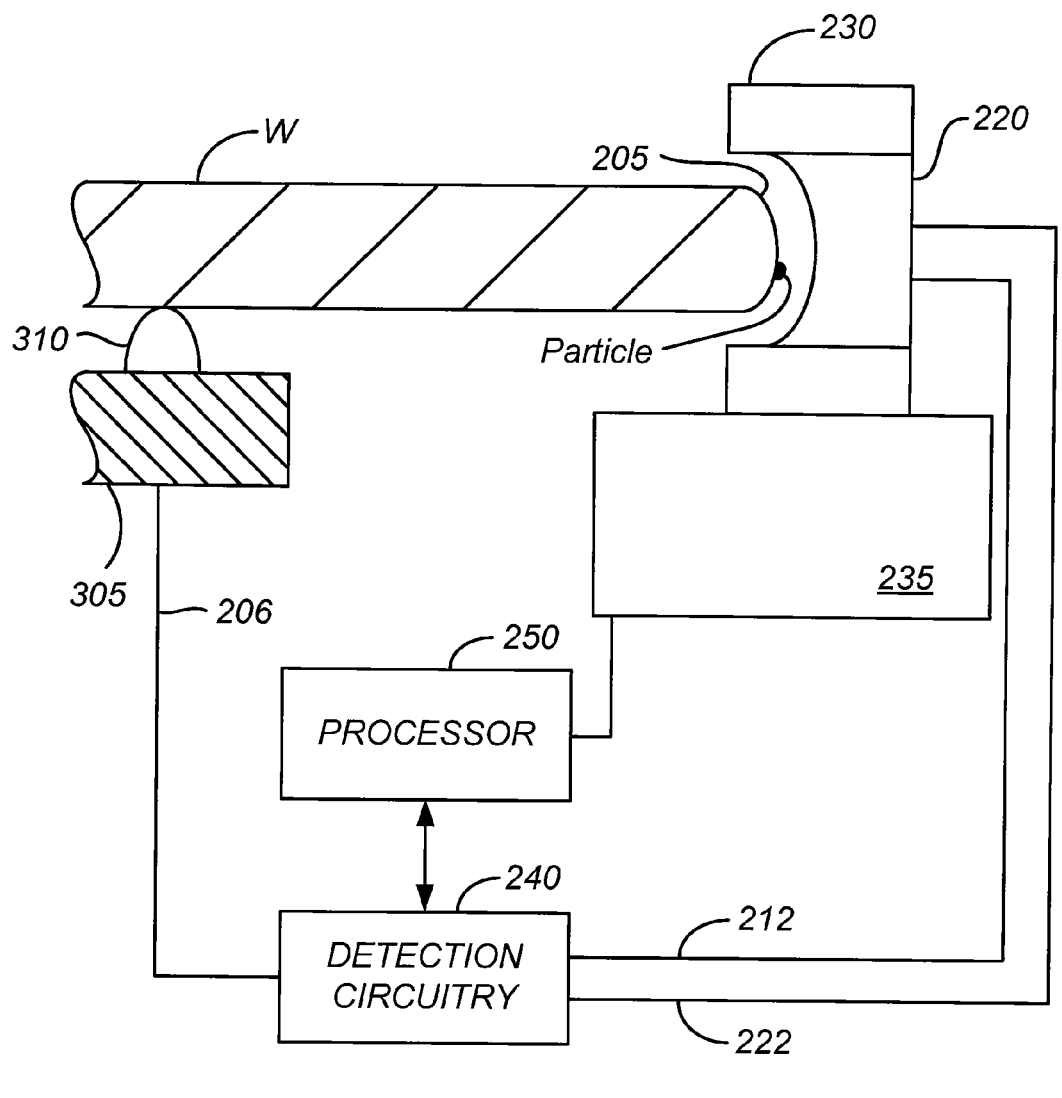
FIG. 3 is a simplified schematic diagram illustrating a cross sectional view of a wafer bevel particle detection apparatus according to an embodiment of the present invention.

FIG. 3 is a simplified schematic diagram illustrating a cross sectional view of a wafer bevel particle detection apparatus according to an embodiment of the present invention. As illustrated in FIG. 3, a wafer "W" is supported by a substrate support 305 including proximity pins 310. For purposes of clarity, only a portion of the substrate and substrate support are illustrated in FIG. 3. Sensor housing 230 is located adjacent the outer edge of the wafer "W" and surrounds the wafer bevel. Probe electrode 220 is mounted in the sensor housing. Although a single probe electrode is illustrated in FIG. 3, additional probe electrodes are provided in alternative embodiments. In the embodiment illustrated in FIG. 3, the inner edge of the probe electrode is fabricated to have a cross-sectional radius of curvature approximately matched to the cross-sectional radius of curvature of the wafer bevel. The probe electrode may be fabricated from a refractory metal.

As discussed with reference to FIG. 2, the sensor housing is mounted on a translatable stage 235 that is able to move in the x-direction (radial direction), the y-direction (in the plane of the substrate), and the z-direction (normal to the surface of the substrate). In some embodiments, the translatable stage 235 is also able to rotate about the z-axis. Motion of the sensor housing in the x-direction provides for control of the distance between the wafer bevel and the one or more probe electrodes mounted in the sensor housing. As described with reference to FIG. 2, the sensor housing contains one or more position sensors that are utilized in providing motion control signals to the translatable stage 235.

As the substrate rotates about the z-axis, the position sensors 210, along with other system components, are utilized to maintain a constant gap between the wafer bevel and the portion of the probe electrode 220 facing the wafer bevel. The amount of motion in the x-direction of translation stage 235 will depend on the accuracy with which the wafer is centered on the substrate support and any eccentricities present in the shape of the wafer, among other factors. Electrical signals from the one or more position sensors 210 are provided to detection circuitry 240 and processor 250, which operate in a feedback loop with translation stage 235.

While the wafer is rotating with a constant gap between the substrate and the probe electrode, a baseline voltage will be determined in the absence of particles by applying a voltage bias between the wafer W and the probe electrode 220. The voltage at which a corona discharge event will occur will be a function of the presence of particles on the wafer bevel. For example, locations free of particles will have higher discharge voltages than locations with particles. Since the wafer processing environment is a very clean environment, the likelihood of particles on the wafer bevel is low. Thus, during a rotation of the wafer, numerous measurements at voltages higher than the corona discharge voltage of a location with a particle will be measured. In an embodiment, the voltage potential between the wafer and the probe electrode is initially set at a level well below voltages that will result in a corona discharge. The voltage potential is increased after each rotation, until a number of corona discharge events are detected. Thus, a baseline voltage is determined and utilized in the particle detection process.

During particle detection operations, portions of the wafer bevel on which particles are present will experience a corona discharge as the particle opposes the probe electrode, allowing a small amount of current to flow. The presence of a particle is detected by measuring either the voltage between the probe electrode and the wafer bevel as a function of position or the current flow between the probe electrode and the wafer. In voltage monitoring mode, detecting a decreased voltage will be associated with the presence of a particle. In an embodiment utilizing multiple probe housings positioned around the periphery of the wafer, the potential on each of the multiple probe electrodes is compared while the same voltage is applied through a high impedance circuit between each electrode and the wafer. A drop in the potential at one of the probe electrodes in comparison to the voltage potential on the other probe electrodes will be associated with the presence of a particle. The size of particles detected will be a function of the gap size between the wafer bevel and the probe electrode, the variations in gap size as function of position around the bevel, the sensitivity of the differential charge detector, and the like.

In current monitoring mode, detecting current flow across the wafer bevel/probe electrode gap will be associated with the presence of a particle. The current flow changes the potential on the probe electrode, which can be picked up by a galvanometer or equivalent differential charge detector. The current flow as a result of the corona discharge is a function of the number of electrons transferred from the particle to the particular probe electrode adjacent the particle. According to embodiments of the present invention, in order to reduce any damage to the bevel of the wafer resulting from the occurrence of a corona discharge, the detection circuitry 240 connected to the probe electrodes 220 utilizes a limiting resistor/capacitor combination to ensure sufficient current flow for detection, while also ensuring that the current flow is not sufficiently high to cause unacceptable levels of wafer bevel damage. A processor 250 utilizes electrical signals from the detection circuitry to detect the presence of a corona discharge and associate such a discharge with the presence of a particle.

Referring to FIG. 3, a particle is present on the wafer bevel at the plane illustrated in the cross-sectional view shown in FIG. 3. Utilizing the baseline detection process described above, the voltage potential between the wafer and probe electrode is set at the baseline voltage. As the rotation of the wafer moves the particle to the position illustrated in FIG. 3, the electric field in the vicinity of the particle is increased by the presence of the particle, preferably leading to a corona discharge from the particle to the probe electrode 220. Thus, for portions of the wafer bevel free from particles, a potential equal to the baseline voltage applied between the wafer and the probe electrode will not result in corona discharge during rotation of the substrate.

In an embodiment, the discharge is detected by comparing the potential on each of several probe electrodes while applying the same voltage through a high impedance circuit to each probe electrode. Generally, the voltage potential between the probe electrodes and the wafer is on the order of 20 volts, depending on the gap between the wafer bevel and the probe electrode, among other factors.

A counter electrode, for example, located on the substrate support 305, is utilized to maintain the wafer potential near ground potential during measurements. According to embodiments of the present invention, the counter electrode is positioned close to, but not in contact with the wafer. The counter electrode is biased at the opposite potential of the probe electrode and the area of the counter electrode is selected to match capacitance values. Thus, the wafer is used to maintain the potential of the wafer near ground potential. In an embodiment, the counter electrode is part of the position sensors, which are used to maintain the probe electrodes at the predetermined gap as described above.

Although a single sensor housing 230 is illustrated in FIGS. 2 and 3, the present invention is not limited to the use of a single sensor housing. In alternative embodiments, multiple sensor housings, mounted on corresponding translatable stages, are utilized at several peripheral positions of the wafer. Moreover, the multiple sensor housings may include one or more probe electrodes and one or more position sensors as appropriate to the particular application. Wafer cleaning and particle removal techniques are utilized to remove the particles detected using embodiments of the present invention, thereby preventing such particles from adversely impacting the fabrication process.

Figure 4:
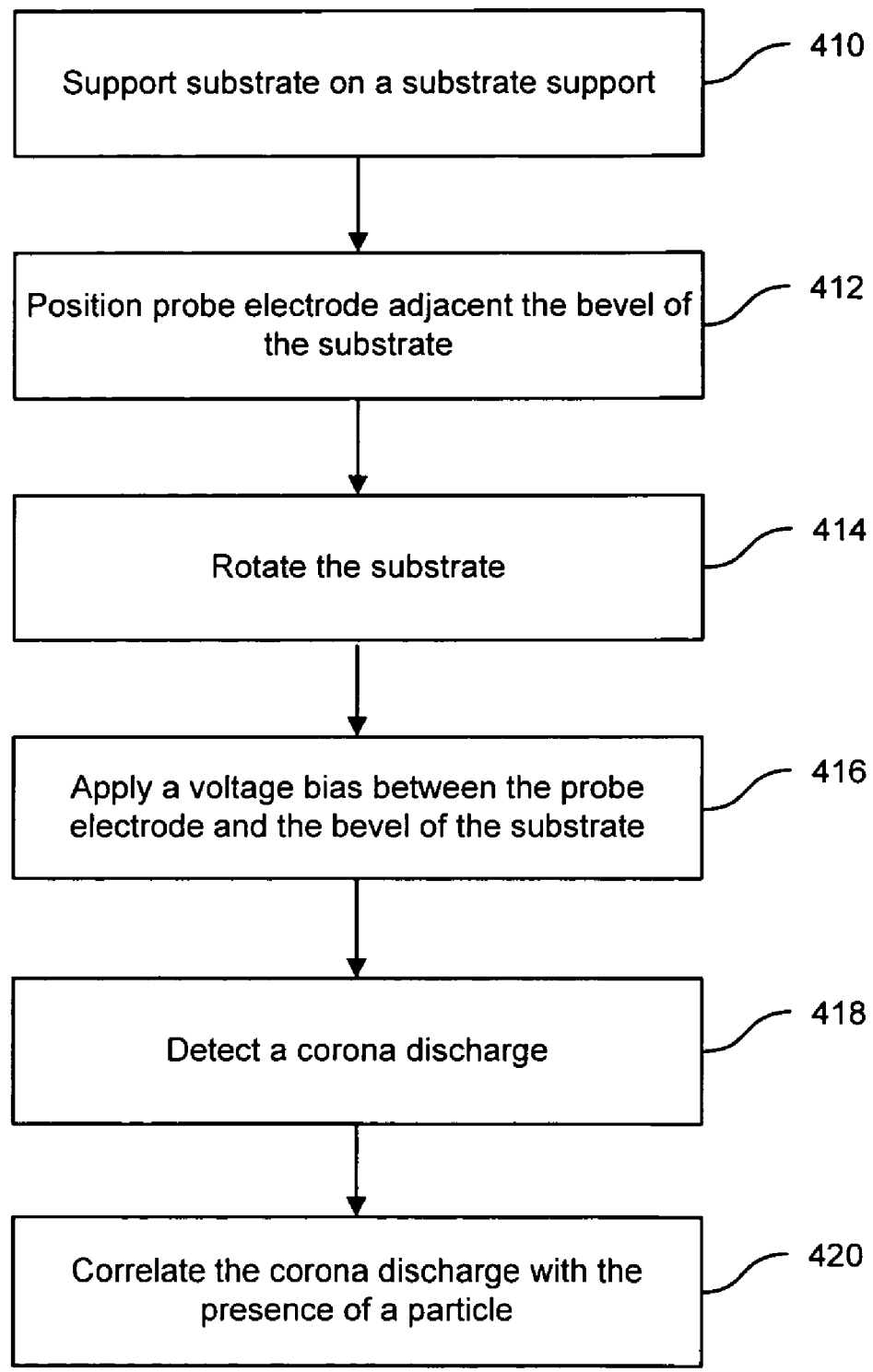
FIG. 4 is a simplified flowchart illustrating a method of detecting particles on a wafer bevel according to an embodiment of the present invention.

FIG. 4 is a simplified flowchart illustrating a method of detecting particles on a wafer bevel according to an embodiment of the present invention. A substrate is supported on a substrate support in a substantially horizontal orientation (410) and a probe electrode is positioned adjacent to the bevel of the substrate (412). In some embodiments, the process of positioning the probe electrodes includes using one or more position sensors mounted in a sensor housing along with the probe electrode. Moreover, some embodiments utilize a number of probe electrodes, either in a single sensor housing or multiple sensor housings.

As described above, the position sensors may be capacitive sensors adapted to measure a capacitance between each of the position sensors and the wafer bevel. A feedback loop is provided that utilizes the data from the position sensors to control a translatable stage on which the sensor housing is mounted. Accordingly, the position sensors are utilized not only to determine the position of the probe electrodes with respect to the substrate, but to control this position within a predetermined range.

The substrate is rotated (414) so that portions of the wafer bevel pass by the probe electrode in a continuous and/or sequential manner. In some embodiments, the rotation of the wafer is initiated after the probe electrode is positioned with respect to the wafer, whereas in other embodiments, the rotation of the wafer is initiated prior to the positioning process. Variation in the distance between the probe electrode and the wafer bevel is measured using the position sensors and adjustments are made to maintain the distance within a predetermined range as the substrate rotates. As a result, the various portions of the wafer bevel pass by the probe electrodes at a substantially constant distance. In a particular embodiment, the rotation of the wafer is performed at a continuous angular velocity, although this is not required by the present invention. Alternatively, the wafer may be rotated to a predetermined angle, where position measurement and adjustment performed, followed by rotation to a second predetermined angle. One of ordinary skill in the art would recognize many variations, modifications, and alternatives.

A voltage is applied between the probe electrode and the bevel of the substrate (416). Generally, the voltage is set at a level less than a potential that will produce an electrical discharge between the probe electrode and the bevel. As discussed in relation to substrate rotation, the application of the voltage potential may be performed prior to rotation of the wafer or after rotation is initiated. In some embodiments, the voltage is ramped up from a first level to a second level as a function of time.

A baseline potential is established based, in part, on measurements of the voltage potential between the probe electrode and the wafer bevel. In an embodiment, the baseline potential is established by rotating the substrate while maintaining a substantially constant gap and increasing the voltage potential until electrical discharges are measured for a number of wafer bevel positions. Since the wafer processing environment is a very clean environment, the likelihood of particles on the wafer bevel is low. Thus, portions of the bevel including a particle will produce a corona discharge at voltage potentials less than the baseline potential associated with particle-free portions of the wafer bevel.

A corona discharge is detected (418) between the bevel of the wafer and the probe electrode and the corona discharge is correlated with the presence of a particle (420). Due to the higher electric fields associated with a particle, corona discharges associated with particles will occur at voltage levels less than the baseline potential. Thus, in an embodiment, measurements of voltage potentials below the baseline potential are correlated with the presence of a particle on the wafer bevel. In a particular embodiment, the voltage bias between the probe electrode and the wafer bevel is set at a level below the baseline potential and above that associated with corona discharge associated with a particle. Correlation of the reduction in voltage potential resulting from a corona discharge is performed using detection circuitry, a processor, and the like. In other embodiments, the corona discharge is detected by detecting current flow across the wafer bevel/probe electrode gap and associated the increased current with the presence of a particle.

It should be appreciated that the specific steps illustrated in FIG. 4 provide a particular method of detecting a particle on a wafer bevel according to an embodiment of the present invention. Other sequence of steps may also be performed according to alternative embodiments. For example, alternative embodiments of the present invention may perform the steps outlined above in a different order. Moreover, the individual steps illustrated in FIG. 4 may include multiple sub-steps that may be performed in various sequences as appropriate to the individual step. Furthermore, additional steps may be added or removed depending on the particular applications. One of ordinary skill in the art would recognize many variations, modifications, and alternatives.

The examples and embodiments described herein are for illustrative purposes only. Various modifications or changes in light thereof will be suggested to persons skilled in the art and are to be included within the spirit and purview of this application and scope of the appended claims. It is not intended that the invention be limited, except as indicated by the appended claims.

What is claimed is:

1. An apparatus adapted to detect a particle present on a bevel of a wafer, the apparatus comprising:
   a substrate support adapted to support the wafer in a substantially horizontal orientation in a first plane and provide electrical contact to the wafer; the wafer being characterized by a center and a radial distance from the center to the bevel;
   a sensor housing positioned in a second plane at a distance from the center of the wafer, the distance measured along the second plane being greater than the radial distance and adapted to receive an edge of the wafer, the sensor housing partially surrounding the wafer on at least three sides, the sensor housing comprising:
   one or more probe electrodes; and
   one or more position sensors adapted to monitor a distance between the bevel of the wafer and the one or more probe electrodes;
   a translatable stage coupled to the sensor housing, wherein the translatable stage is adapted to control the distance between the bevel of the wafer and the one or more position sensors;
   electrical circuitry electrically coupled to the substrate support and the one or more probe electrodes and adapted to generate an electric field between the bevel of the wafer and the one or more probe electrodes, wherein the electric field creates a corona discharge from the particle;
   detection circuitry electrically coupled to the electrical circuitry; and
   a processor adapted to process electrical signals associated with the detection circuitry and thereby detect the particle present on the bevel of the wafer.

2. The apparatus of claim 1 wherein the substrate support is further adapted to rotate the wafer.

3. The apparatus of claim 1 wherein the probe electrode is fabricated from a refractory metal.

4. The apparatus of claim 1 wherein the position sensor comprises a capacitive position sensor.

5. The apparatus of claim 1 wherein the translatable stage is adapted to translate in a first direction aligned with a radius of the wafer.

6. The apparatus of claim 5 wherein the translatable stage is further adapted to translate in a second direction perpendicular to the first direction.

7. The apparatus of claim 1 wherein the electrical signals associated with the detection circuitry comprise voltages between the bevel of the wafer and the one or more probe electrodes.

8. A method of detecting a particle attached to a bevel of a substrate, the method comprising:
   positioning a probe electrode adjacent to the bevel of the substrate, the substrate being characterized by a center and a radial distance from the center to the bevel, wherein the probe electrode is situated within a probe housing which partially surrounds the substrate on at least three sides and the probe electrode is positioned at a distance from the center of the substrate, the distance being measured in a plane containing the center and the bevel, the distance being greater than the radial distance;
   providing an electric potential between the bevel of the substrate and a probe electrode;
   rotating the substrate;
   detecting a corona discharge between the bevel of the substrate and a probe electrode; and
   correlating the corona discharge with a presence of the particle.

9. The method of claim 8 wherein positioning a probe electrode comprises translating a probe housing containing the probe electrode.

10. The method of claim 9 wherein the probe housing is mounted on a translatable stage adapted to control a distance between the bevel of the substrate and the probe electrode.

11. The method of claim 8 wherein rotating the substrate comprises rotating the substrate about an axis normal to a surface of the substrate.

12. The method of claim 8 wherein detecting a corona discharge comprises measuring a reduced voltage compared to a baseline voltage.

13. The method of claim 8 wherein detecting a corona discharge comprises measuring an increase in current flow between the substrate and the probe electrode.

14. The method of claim 8 further comprising removing the particle from the bevel of the substrate.

15. A method of detecting a particle present on a bevel of a substrate, the method comprising:
   supporting the substrate on a substrate support in a substantially horizontal orientation in a first plane, the substrate being characterized by a center and a radial distance to the bevel;
   positioning a probe housing comprising a probe electrode adjacent to the bevel of the substrate, wherein the probe housing partially surrounds the wafer on at least three sides and the probe housing is positioned at a distance from the center of the substrate greater than the radial distance to the bevel, the distance being measured along a second plane parallel to the first plane;
   applying a voltage potential between the bevel of the substrate and the probe electrode;
   rotating the substrate;
   measuring a first voltage potential at a first time;
   establishing a baseline potential based in part on measuring the voltage potential;
   measuring a second voltage potential at a second time, wherein the second voltage potential is less than the first voltage potential; and
   correlating the second voltage potential with the particle.

16. The method of claim 15 wherein positioning the probe housing comprises translating the probe housing in a first direction aligned with a radius of the substrate.

17. The method of claim 16 wherein positioning the probe housing further comprises translating the probe housing in a second direction perpendicular to the first direction.

18. The method of claim 15 wherein rotating the substrate comprises rotating the substrate about an axis normal to a surface of the substrate.

19. The method of claim 15 wherein the second voltage potential is associated with a corona discharge.

20. The method of claim 15 wherein the probe electrode is fabricated from a refractory metal.

* * * * *